(12) United States Patent
Ozawa et al.

(10) Patent No.: US 6,366,173 B1
(45) Date of Patent: Apr. 2, 2002

(54) PHASE SYNCHRONOUS CIRCUIT AND ELECTRONIC DEVICE USING THE SAME

(75) Inventors: Nobuhisa Ozawa; Miho Akahide, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/427,481

(22) Filed: Oct. 27, 1999

(30) Foreign Application Priority Data

Oct. 28, 1998 (JP) ............................................. 10-307525

(51) Int. Cl.[7] ................................................. H03L 7/00
(52) U.S. Cl. ...................... 331/11; 331/17; 331/DIG. 2; 348/536; 348/725; 348/726
(58) Field of Search .............................. 331/17, 11, 74, 331/20, DIG. 2; 348/725, 545, 540, 536, 726

Primary Examiner—Arnold Kinkead
(74) Attorney, Agent, or Firm—Ronald P. Kananen; Rader, Fishman & Grauer

(57) ABSTRACT

A phase synchronous circuit includes a comparing unit for comparing an output of a low-pass filter with a reference voltage which causes the central frequency of a voltage-controlled oscillator to be set as well as generating a compared output voltage by integrating a compared output current, a frequency oscillator for generating a frequency signal to frequency-modulate an output of the voltage-controlled oscillator and a switching unit for, in the presence of an input signal to the phase synchronous circuit, causing the compared output voltage to provide negative-feedback to a second control terminal of the voltage-controlled oscillator, whereas, in the absence of the input signal, to the phase synchronous circuit, causing the frequency signal to be input to the second control terminal of the voltage-controlled oscillator.

10 Claims, 2 Drawing Sheets

PHASE SYNCHRONOUS CIRCUIT AND ELECTRONIC DEVICE USING THE SAME

BACKGROUND OF THE INVENTION

1. Field of the Invention

The present invention relates to phase synchronous circuits and electronic devices using the same, and more particularly to a phase synchronous circuit including a phase detector circuit, a low-pass filter, and a voltage-controlled oscillator, and an electronic device using the same which facilitates phase synchronization, obviates the need for adjusting an inductance of each inductor therein, and is suitably incorporated into a monolithic semiconductor integrated circuit.

2. Description of the Related Art

With reference to FIG. 3, a known phase synchronous circuit 16 for detecting a video carrier in an intermediate frequency processing circuit for a television, a videocassette recorder, or the like is explained in detail.

In FIG. 3, an intermediate frequency signal is input to a phase detector circuit 1 where a phase synchronous detection is performed by extracting the video carrier. The output from the phase detector circuit 1 is filtered at a low-pass filter ("LPF") 2. The filtered output signal causes an oscillating frequency from a voltage-controlled oscillator ("VCO") 3 to provide negative-feedback to the phase detector circuit 1. Those above-described components form a so-called "phase-locked loop (PLL)" so that the phase synchronous circuit 16 controls a phase difference between the oscillating frequency from the VCO 3 and the video carrier frequency of the input intermediate frequency to be ninety degrees. The above-described condition is called a "phase-locked condition".

At a ninety-degree phase shift circuit 5, a signal having the same phase as that of the video carrier is obtained by shifting the phase-locked oscillating frequency from the VCO 3 by another ninety degrees. The output from the ninety-degree phase shift circuit 5 is input to a video detector circuit 6 where the intermediate frequency signal is synchronously detected. In particular, considering the temperature characteristics and the detecting efficiency of the video detector circuit 6 which consists of semiconductor integrated circuits, the above-described phase synchronous detecting method is applied to the video detector circuit 6.

At the phase synchronous circuit 16, a central frequency within a variable frequency range of the VCO 3 is set so as to be equal to the video carrier frequency. Subsequent to being phase-locked in the phase synchronous circuit 16, the oscillating frequency of the output signal from the VCO 3 is equal to the video carrier frequency and the phase of the output signal is ninety degrees out of phase with that of the video carrier.

The central frequency of the VCO 3 must be accurately matched with the video carrier frequency. Otherwise, an error due to failure to be matched directly affects the video detector output and brings about differential phase characteristics and the production of noise. Therefore, conventionally, an external variable inductor 4 is introduced to the VCO 3 to adjust the central frequency by compensating for characteristics dispersions in the capacitors and the internal circuit of the VCO 3 as well as varying an inductance of the inductor 4.

The above method for adjusting the central frequency using the variable inductor has the following problems:

1) Even after the central frequency adjustment, further adjustment is required due to the temperature characteristics, aging deterioration, and the like in the internal circuit of the VCO 3, the capacitors, and the variable inductor 4;
2) The need for the variable inductor 4 makes it difficult to incorporate the phase synchronous circuit 16 into a monolithic integrated circuit; and
3) A considerable number of processes are required for adjusting the central frequency of the VCO 3 when the phase synchronous circuit 16 is manufactured;

SUMMARY OF THE INVENTION

Accordingly, it is an object of the present invention to provide a phase synchronous circuit which eliminates a need for adjusting a voltage-controlled oscillator and is suitable for incorporating into a monolithic integrated circuit without using an inductance element such as a coil. In addition, it is another object of the present invention to provide an electronic device employing the phase synchronous circuit.

To this end, according to the first aspect of the present invention, a phase synchronous circuit is provided for detecting the phase of an input signal by a phase detector circuit, filtering an output of the phase detector circuit by a low-pass filter, establishing connection so as to cause an output of the low-pass filter to provide negative feedback to a first control terminal of a voltage-controlled oscillator, and inputting an output of the voltage-controlled oscillator to the phase detector circuit, thereby phase-synchronizing the frequency of the input signal with the central frequency of the voltage-controlled oscillator. The phase synchronous circuit includes a comparing unit for comparing an output of the low-pass filter with a reference voltage which causes the central frequency of the voltage-controlled oscillator to be set and for generating a compared output by integrating a compared output current, a frequency oscillator for generating a frequency signal to frequency-modulate the output of the voltage-controlled oscillator and a switching unit for causing the compared output to provide negative feedback to a second control terminal of the voltage-controlled oscillator when the input signal is supplied to the phase synchronous circuit, while causing the frequency signal to be input to the second control terminal of the voltage-controlled oscillator when the input signal is not supplied to the phase synchronous circuit.

In the phase synchronous circuit, the comparing unit may include a first comparator for comparing the output of the low-pass filter with the reference voltage, the first comparator having a current output terminal which causes a current corresponding to a first compared output to be output, a capacitor, provided between the current output terminal and a ground, for integrating the current corresponding to the first compared output, and a buffer amplifier for supplying the switching unit with the generated compared output.

In the phase synchronous circuit, the comparing unit may include a first comparator for comparing the output of the low-pass filter with the reference voltage, the first comparator having a current output terminal which causes a current corresponding to a first compared output to be output, a capacitor, provided between the current output terminal and a ground, for integrating the current corresponding to the first compared output and a buffer amplifier for supplying the second control terminal of the voltage-controlled oscillator with the generated compared output. The frequency oscillator may include a second comparator for comparing the compared output with a variable bias voltage and supplying the switching unit with a second compared output, a third comparator for comparing one of an output of the switching unit and the compared output with a fixed bias voltage and causing a third compared output to be output both to a reference voltage varying unit for varying the reference voltage and to a bias varying unit for varying the variable bias voltage. When the second compared output from the second comparator is not supplied through the switching unit to the third comparator, the reference voltage may be set so as to lead the oscillating frequency of the voltage-controlled oscillator to be the central frequency and the compared output is allowed to be input to the second control terminal of the voltage-controlled oscillator through the buffer amplifier while when the second compared output from the second comparator is supplied through the switching unit to the third comparator, the first comparator, the second comparator, and the third comparator may be provided to be a positive feedback circuit network which allows the frequency signal to be input to the second control terminal of the voltage-controlled oscillator through the buffer amplifier.

In the phase synchronous circuit, the first and second control terminals of the voltage-controlled oscillator each may have independent frequency control sensitivity.

According to the second aspect of the present invention, an electronic device is provided with a phase synchronous circuit which is provided for detecting the phase of an input signal by a phase detector circuit, filtering an output of the phase detector circuit by a low-pass filter, establishing connection so as to cause an output of the low-pass filter to provide negative-feedback to a first control terminal of a voltage-controlled oscillator, and inputting an output of the voltage-controlled oscillator to the phase detector circuit, thereby phase-synchronizing the frequency of the input signal with the central frequency of the voltage-controlled oscillator. The phase synchronous circuit includes a comparing unit for comparing the output of the low-pass filter with a reference voltage which causes the central frequency of the voltage-controlled oscillator to be set and for generating a compared output by integrating a compared output current, a frequency oscillator for generating a frequency signal to frequency-modulate the output of the voltage-controlled oscillator; and a switching unit for causing the compared output to provide negative feedback to a second control terminal of the voltage-controlled oscillator when the input signal is supplied to the phase synchronous circuit, while causing the frequency signal to be input to the second control terminal of the voltage-controlled oscillator when the input signal is not supplied to the phase synchronous circuit.

According to the third aspect of the present invention, a phase synchronous circuit is provided for detecting the phase of an input signal by a phase detector circuit, filtering an output of the phase detector circuit by a low-pass filter, having an output of the low-pass filter provide negative-feedback to a first control terminal of a voltage-controlled oscillator, and inputting an output of the voltage-controlled oscillator to the phase detector circuit, thereby phase-synchronizing the frequency of the input signal with the central frequency of the voltage-controlled oscillator. The phase synchronous circuit includes a comparing unit for comparing the output of the low-pass filter with a reference voltage which causes the central frequency of the voltage-controlled oscillator to be set, and for generating a compared output voltage by integrating a compared output current, a low-frequency oscillator for generating a low-frequency signal to frequency-modulate the output of the voltage-controlled oscillator and a switching unit for causing the compared output voltage to provide negative feedback to a second control terminal of the voltage-controlled oscillator when the input signal is supplied to the phase synchronous circuit, while causing the low-frequency signal to be input to the second control terminal of the voltage-controlled oscillator when the input signal is not supplied to the phase synchronous circuit.

In the phase synchronous circuit, the comparing unit may include a first comparator for comparing the output of the low-pass filter with the reference voltage, the first comparator having a current output terminal which causes a current corresponding to a first compared output to be output, a capacitor, provided between the current output terminal and a ground, for integrating the current corresponding to the first compared output and a buffer amplifier for supplying the switching unit with the generated compared output voltage.

In the phase synchronous circuit, the comparing unit may include a first comparator for comparing the output of the low-pass filter with the reference voltage, the first comparator having a current output terminal which causes a current corresponding to a first compared output to be output, a capacitor for integrating the current corresponding to the first compared output, and the capacitor provided between the current output terminal and a ground and a buffer amplifier for supplying a second control unit for the voltage-controlled oscillator with the generated compared output voltage. The low-frequency oscillator may include a second comparator for comparing the compared output voltage with a variable bias voltage and supplying the switching unit with a second compared output, a third comparator for comparing one of an output of the switching unit and the compared output voltage with a fixed bias voltage and causing a third compared output to provide positive-feedback both to reference a voltage varying unit for varying the reference voltage and to a bias varying unit for varying the variable bias voltage. When the second compared output from the second comparator is not supplied through the switching unit to the third comparator, the reference voltage may be set so as to lead the oscillating frequency of the voltage-controlled oscillator to be the central frequency and the compared output voltage is allowed to be input to the second control terminal of the voltage-controlled oscillator through the buffer amplifier while when the second compared output from the second comparator is supplied through the switching unit to the third comparator, the first comparator, the second comparator, and the third comparator may be provided to be a positive feedback circuit network which allows the low-frequency signal to be input to the second control terminal of the voltage-controlled oscillator through the buffer amplifier.

In the phase synchronous circuit, the first and second control terminals of the voltage-controlled oscillator each may have an independent frequency control sensitivity.

According to the fourth aspect of the present invention, an electronic device is provided with a phase synchronous circuit which is provided for detecting the phase of an input signal by a phase detector circuit, filtering an output of the phase detector circuit by a low-pass filter, having an output of the low-pass filter provide negative feedback to a first control terminal of a voltage-controlled oscillator, and inputting an output of the voltage-controlled oscillator to the phase detector circuit, thereby phase-synchronizing the frequency of the input signal with the central frequency of the voltage-controlled oscillator. The phase synchronous circuit includes a comparing unit for comparing the output of the low-pass filter with a reference voltage which causes the central frequency of the voltage-controlled oscillator to be set, and for generating a compared output voltage by integrating a compared output current, a low-frequency oscillator for generating a low-frequency signal to frequency-modulate the output of the voltage-controlled oscillator and a switching unit for causing the. compared output voltage to provide negative-feedback to a second control terminal of the voltage-controlled oscillator when the input signal is supplied to the phase synchronous circuit, while causing the low-frequency signal to be input to the second control terminal of the voltage-controlled oscillator when the input signal is not supplied to the phase synchronous circuit.

When the input signal to the phase synchronous circuit is detected, negative phase-control is started where the central frequency of the voltage-controlled oscillator is set to be equal to the frequency of the input signal. Finally, the phase synchronous circuit is put into the phase-locked condition. Therefore, no further adjustment is required.

When the input signal carrier is not detected, the output frequency of the voltage-controlled oscillator varies at a low speed between the upper bound and the lower bound of the variable frequency range where the period of the oscillation of the voltage-controlled oscillator is equal to that of a low-frequency oscillator. The phase synchronous circuit is put into a "stand-by condition". When a new input signal arrives, and as soon as the oscillating frequency of the voltage-controlled oscillator reaches the input signal frequency, phase-locking is performed. Immediately, the switching unit allows the second control terminal of the voltage-controlled oscillator to be disconnected from the output of the low-frequency oscillator, then to be connected to the comparing unit instead. As described above, negative-feedback phase-control is started, and the phase synchronous circuit is put into the phase-locked condition. Therefore, the phase synchronous circuit of the present invention capable of reducing required time to be phased-locked.

The phase synchronous circuit of the present invention can be offered with its fast phase-locking ability as well as its suitability for being incorporated into the monolithic integrated circuit. Furthermore, the phase synchronous circuit of the present invention is not limited to process the intermediate frequency signal in a television and the video-cassette recorder, and is applicable to general electronic devices as long as the devices require the phase synchronous circuit.

DESCRIPTION OF THE PREFERRED EMBODIMENTS

Figure 1:
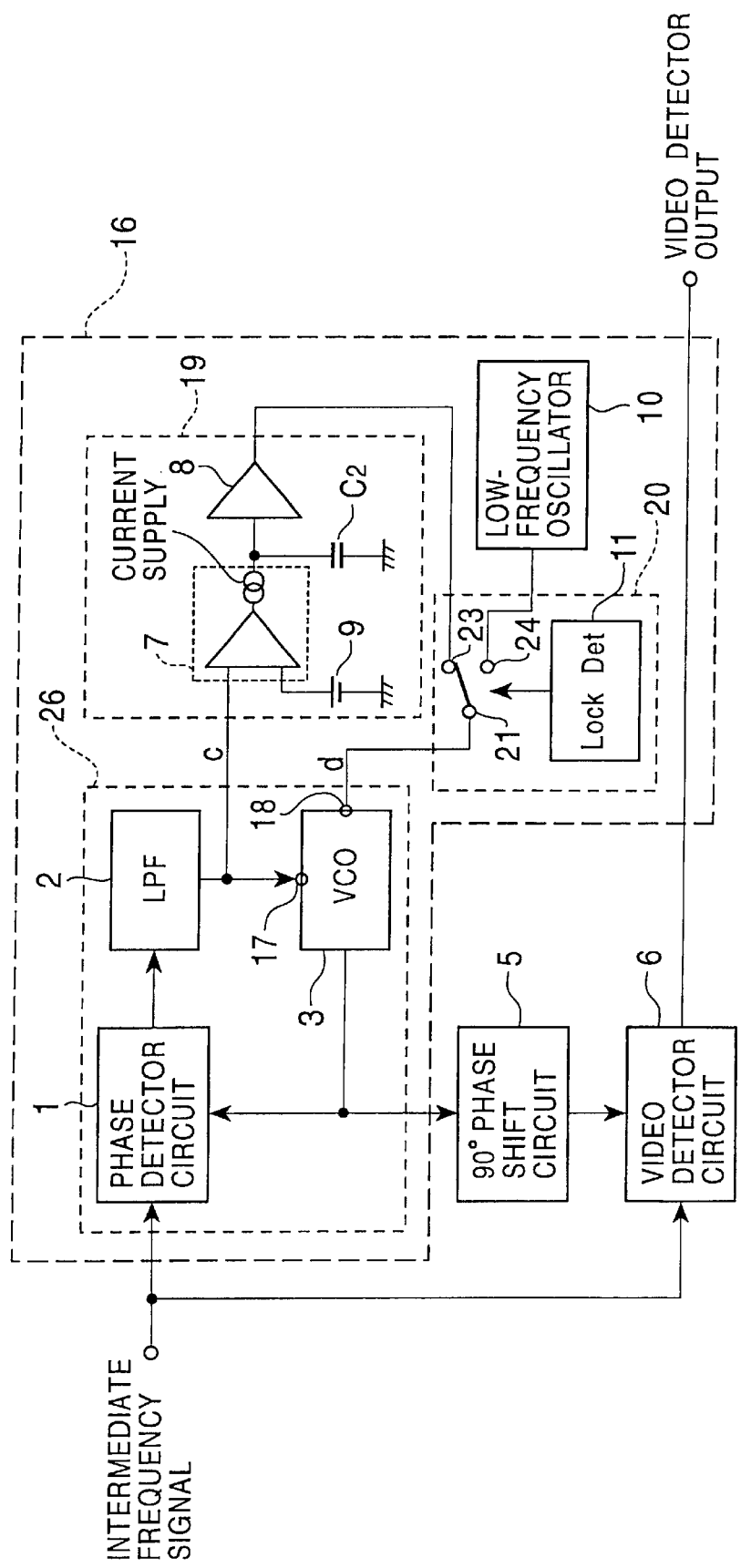
FIG. 1 is a block diagram of a phase synchronous circuit according to an embodiment of the present invention.
Figure 3:
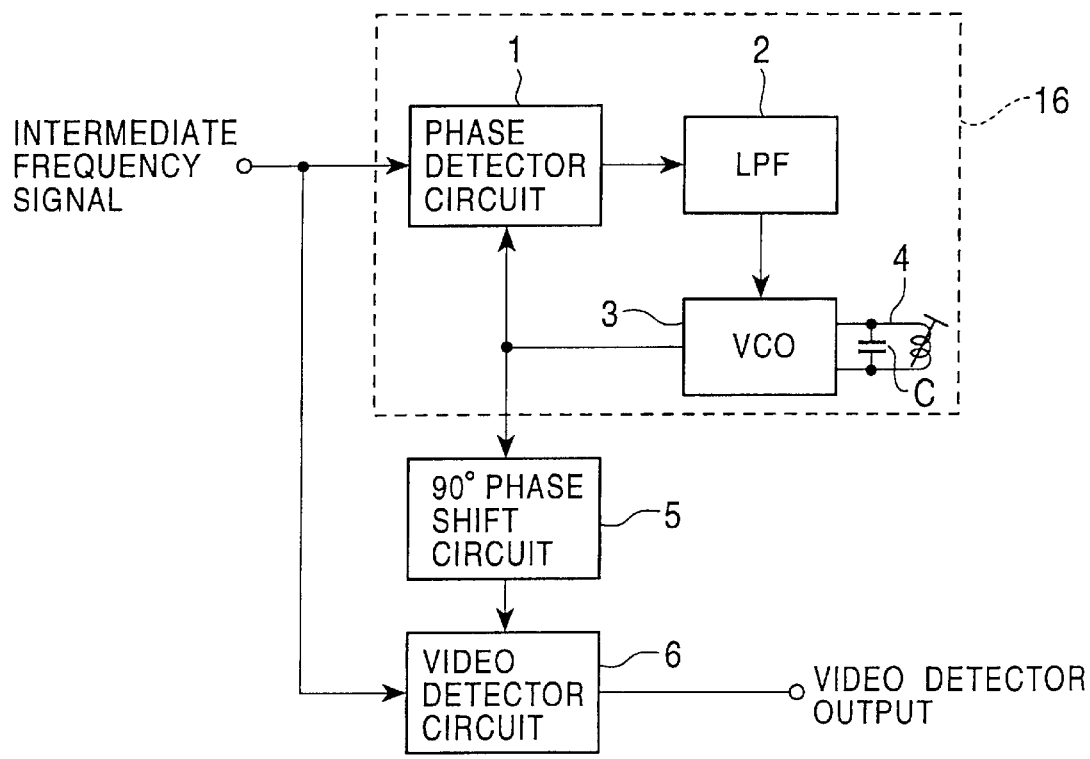
FIG. 3. is a block diagram of a conventional phase synchronous circuit.

FIG. 1 shows an intermediate-frequency-signal phase synchronous circuit for a television, a videocassette recorder, or the like. The phase synchronous circuit and an electronic device provided therewith are explained in detail as the embodiments. However, the phase synchronous circuit of the present invention and the electronic device provided therewith are not limited to the embodiments and are applicable to a general electronic device having a phase synchronous circuit. Incidentally, when any component of the phase synchronous circuit in the embodiments and its counterpart of a known phase synchronous circuit in FIG. 3 have the same structure, the component is assigned the same numeral as its counterpart.

In FIG. 1, a video carrier of the intermediate frequency signal is phase-detected at a phase detector circuit 1 and provides negative feedback via an LPF 2 to a first control terminal 17 of a VCO 3 which, in turn, is output to the phase detector circuit 1. That is, the above-described components form a PLL.

The output of the LPF 2 is also output at output terminal C to a comparing unit 19. The comparing unit 19 includes a first comparator 7, a reference voltage 9, a capacitor $C_2$, and a buffer amplifier 8. The first comparator 7 compares the output from the LPF 2 with the reference voltage 9. By allowing the capacitor $C_2$ to integrate a current output from the first comparator 7, a compared output voltage is obtained. The output voltage is supplied, through the buffer amplifier 8, to a switching unit 20.

A low-frequency oscillator 10 generates, for example, a several hertz sawtooth signal. Under the control of a phase locked detector (hereinafter referred to as a "Lock Det") 11, an output from the switching unit 20 is switched between the output from the low-frequency oscillator 10 and the output from the buffer amplifier 8 at a switch 21 of the switching unit 20.

The output of the Lock Det 11 is generated by, for example, integrating the output from a video detector circuit 6. If a phase synchronous circuit 16 is in a phase-locked condition, the switch 21 is connected to a terminal 23; otherwise the switch 21 is connected to a terminal 24. The switch 21 is also connected to a second control terminal 18 of the VCO 3.

The operation of the phase synchronous circuit 16 in FIG. 1 is explained for a case in which the intermediate frequency is not input thereto and for a case in which the intermediate frequency is input thereto. (The case in which the intermediate frequency is not input to the phase synchronous circuit 16)

This case occurs when, for example, reception of a weak electric field caused by television broadcasting or the like is performed, or when a channel having no signal is received. Since no signal is input to the phase detector circuit 1, the phase synchronous circuit 16 is not in the phase-locked condition. Hence the Lock Det 11 detects no phase-locked condition in the phase synchronous circuit 16, and causes the switch 21 to be connected to the terminal 24 of the low-frequency oscillator 10. As a result, the output of the low-frequency oscillator 10 is output to the second control terminal 18 of the VCO 3. The oscillating frequency output from the VCO 3 varies in accordance with the amplitude of the output voltage from the low-frequency oscillator 10, and oscillates between the upper bound and the lower bound of a variable frequency range. The phase synchronous circuit 16 remains in a "stand-by condition" until another intermediate frequency signal arrives.

(The case in which the intermediate frequency is input to the phase synchronous circuit 16)

When the intermediate frequency signal arrives at the phase synchronous circuit 16 which is in the "stand-by-condition" as described above,. because the oscillating frequency from the VCO 3 traces between the upper bound and lower bound of the variable frequency range, the video carrier frequency of the intermediate frequency signal is phase-locked to some point in between. However, since the output voltage from the low-frequency oscillator 10 varies, the phase-locked condition in the phase synchronous circuit 16 fails to be maintained.

Thus, when phase-locking is performed, the Lock Det 11 detects the phase-locked condition in the phase synchronous circuit 16 and causes the switch 21 to be connected to the terminal 23. Accordingly, since the output from the comparing unit 19 provides negative-feedback to the second control terminal 18 of the VCO 3, the oscillating frequency output from the VCO 3 is negative feedback phase-controlled based on the central frequency, which is equal to the video carrier frequency and which is set by the reference voltage 9. Finally, the phase synchronous circuit 16 is phase-locked.

Because the output from the LPF 2 also provides negative feedback to the first control terminal 17, interference occurs between the control signal from the first control terminal 17 and that from the second control terminal 18. Thus, each control terminal is controlled so that the sensitivity of the frequency control at each terminal is changed. For example, when the sensitivity of the frequency control of the second control terminal 18 is enhanced, although the operation obtained by receiving negative feedback at the first control terminal 17 becomes weaker, the accuracy of the central frequency obtained is enhanced. This is a preferred effect of the phase synchronous circuit 16 and the electronic device provided therewith disclosed in the present invention.

The output signal from VCO 3 is ninety-degrees phase-shifted at a ninety-degrees phase shift circuit 5 and is input to a video detector circuit 6 where the intermediate signal is phase-detected thereby obtaining a video detector output as the output from the video detector circuit 6.

Figure 2:
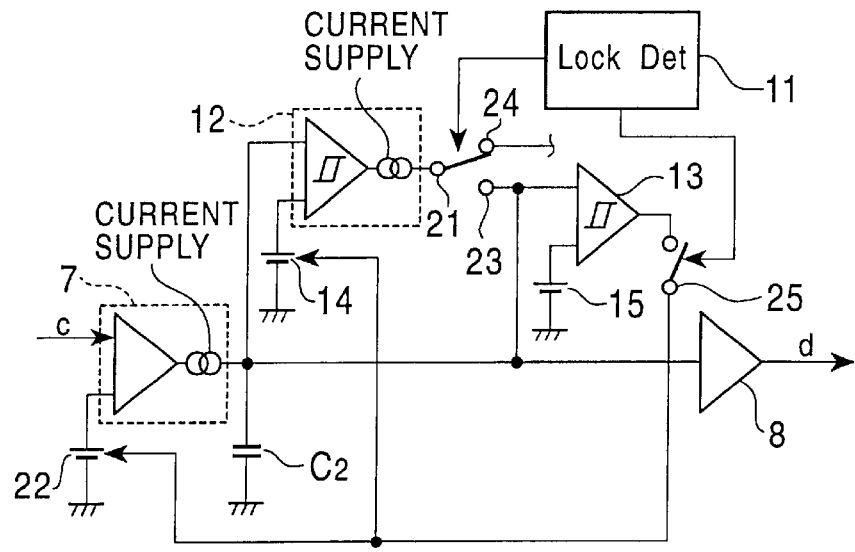
FIG. 2 is a block diagram showing a phase synchronous circuit according to an embodiment of the present invention, in which a switching unit, and a low-frequency oscillator are integrated.

Next, an embodiment in which the comparing unit 19, the low-frequency oscillator 10, and the switch 21 of the switching unit 20 are integrated is described with reference to FIG. 2.

The output from the LPF 2 is input to a point "c". A reference voltage generated at a reference-voltage varying unit 22 and the input from the LPF 2 are compared at the first comparator 7, then the capacitor $C_2$ is charged with the output current from the first comparator 7. Therefore, the compared output voltage is obtained by integrating the output from the first comparator 7. When a phase synchronous loop 26 in FIG. 1 is in the phase-locked condition, the Lock Det 11 causes the switch 21 to be connected to the terminal 24, which leads an open-circuit at a switch 25.

The compared output voltage generated at the capacitor $C_2$ is input to a third comparator 13 where the output from the reference-voltage varying unit 22 is set to be the reference voltage. This compared output voltage provides negative feedback, through the buffer amplifier 8, to the second control terminal 18 of the VCO 3 represented by a point "d" of FIG. 2.

When the phase synchronous loop 26 in FIG. 1 is not in the phase-locked condition, the Lock Det 11 causes the switch 21 to be connected to the terminal 23, which leads to a closed circuit at the switch 25. In such a case, the output from a second comparator 12 and a fixed bias voltage 15 are compared at the third comparator 13, and the compared output is supplied to both the reference-voltage varying unit 22 and a bias voltage varying unit 14. This causes the voltage applied across the capacitor $C_2$ to provide positive feedback. Therefore, an oscillation with a sawtooth low-frequency wave form is produced between the leads of the capacitor $C_2$ where the time constant is determined based on the capacitance of the capacitor $C_2$ and the output current from the first comparator 7. This oscillation is input through the buffer amplifier 8 to the second control terminal 18 of the VCO 3.

What is claimed is:

1. A phase synchronous circuit for detecting the phase of an input signal by a phase detector circuit, filtering an output of said phase detector circuit by a low-pass filter, establishing connection so as to cause an output of said low-pass filter to provide negative feedback to a first control terminal of a voltage-controlled oscillator, and inputting an output of said voltage-controlled oscillator to said phase detector circuit, thereby phase-synchronizing the frequency of said input signal with the central frequency of said voltage-controlled oscillator, said phase synchronous circuit comprising:
   comparing means for comparing the output of said low-pass filter with a reference voltage which causes the central frequency of said voltage-controlled oscillator to be set and for generating a compared output by integrating a compared output current;
   a frequency oscillator for generating a frequency signal to frequency-modulate the output of said voltage-controlled oscillator; and
   switching means for causing said compared output to provide negative-feedback to a second control terminal of said voltage-controlled oscillator when said input signal is supplied to said phase synchronous circuit, while causing said frequency signal to be input to said second control terminal of said voltage-controlled oscillator when said input signal is not supplied to said phase synchronous circuit.

2. A phase synchronous circuit according to claim 1, wherein said comparing means comprises:
   a first comparator for comparing the output of said low-pass filter with said reference voltage, and said first comparator having a current output terminal which causes a current corresponding to a first compared output to be output;
   a capacitor for integrating the current corresponding to said first compared output, and said capacitor provided between said current output terminal and a ground; and
   a buffer amplifier for supplying said switching means with the generated compared output.

3. A phase synchronous circuit according to claim 1, wherein said comparing means comprises:
   a first comparator for comparing the output of said low-pass filter with said reference voltage and said first comparator having a current output terminal which causes a current corresponding to a first compared output to be output;
   a capacitor for integrating the current corresponding to said first compared output, said capacitor provided between said current output terminal and a ground; and
   a buffer amplifier for supplying said second control terminal of said voltage-controlled oscillator with the generated compared output;
   wherein said frequency oscillator comprises:
      a second comparator for comparing said first compared output with a variable bias voltage and supplying said switching means with a second compared output;
      a third comparator for comparing one of an output of said switching means and said second compared output with a fixed bias voltage and causing a third compared output to be output both to reference voltage varying means for varying said variable bias voltage; and wherein when said second compared output from said second comparator is not supplied through said switching means to said third comparator, said reference voltage is set so as to lead the oscillating frequency of said voltage-controlled oscillator to be said central frequency and said first compared output voltage is allowed to be input to said second control terminal of said voltage-controlled oscillator through said buffer amplifier while when said second compared output from said second comparator is supplied through said switching means to said third comparator, said first comparator, said second comparator, and said third comparator are provided to be a positive feedback circuit network which allows said frequency signal to be input to said second control terminal of said voltage-controlled oscillator through said buffer amplifier.

4. A phase synchronous circuit according to claim 1, wherein the first and second control terminals of said voltage-controlled oscillator each have independent frequency control sensitivity.

5. An electronic device provided with a phase synchronous circuit for detecting the phase of an input signal by a phase detector circuit, filtering an output of said phase detector circuit by a low-pass filter, establishing connection so as to cause an output of said low-pass filter to provide negative-feedback to a first control terminal of a voltage-controlled oscillator, and inputting an output of said voltage-controlled oscillator to said phase detector circuit, thereby phase-synchronizing the frequency of said input signal with the central frequency of said voltage-controlled oscillator, said phase synchronous circuit comprising:
  comparing means for comparing the output of said low-pass filter with a reference voltage which causes the central frequency of said voltage-controlled oscillator to be set and for generating a compared output by integrating a compared output current;
  a frequency oscillator for generating a frequency signal to frequency-modulate the output of said voltage-controlled oscillator; and
  switching means for causing said compared output to provide negative-feedback to a second control terminal of said voltage controlled oscillator when said input signal is supplied to said phase synchronous circuit, while causing said frequency signal to be input to said second control terminal of said voltage-controlled oscillator when said input signal is not supplied to said phase synchronous circuit.

6. A phase synchronous circuit for detecting the phase of an input signal by a phase detector circuit, filtering an output of said phase detector circuit by a low-pass filter, having an output of said low-pass filter provide negative-feedback to a first control terminal of a voltage-controlled oscillator, and inputting an output of said voltage-controlled oscillator to said phase detector circuit, thereby phase-synchronizing the frequency of said input signal with the central frequency of said voltage-controlled oscillator, said phase synchronous circuit comprising:
  comparing means for comparing the output of said low-pass filter with a reference voltage which causes the central frequency of said voltage-controlled oscillator to be set, and for generating a compared output voltage by integrating a compared output current;
  a low-frequency oscillator for generating a low-frequency signal to frequency-modulate the output of said voltage-controlled oscillator; and
  switching means for causing said compared output voltage to provide negative feedback to a second control terminal of said voltage-controlled oscillator when said input signal is supplied to said phase synchronous circuit, while causing said low-frequency signal to be input to said second control terminal of said voltage-controlled oscillator when said input signal is not supplied to said phase synchronous circuit.

7. A phase synchronous circuit according to claim 6, wherein said comparing means comprises:
  a first comparator for comparing the output of said low-pass filter with said reference voltage, said first comparator having a current output terminal which causes a current corresponding to a first compared output to be output;
  a capacitor for integrating the current corresponding to said first compared output, and said capacitor provided between said current output terminal and a ground; and
  a buffer amplifier for supplying said switching means with the generated compared output voltage.

8. A phase synchronous circuit according to claim 6, wherein said comparing means comprises:
  a first comparator for comparing the output of said low-pass filter with said reference voltage to provide a first compared output, said first comparator having a current output terminal which causes a current corresponding to the first compared output to be output;
  a capacitor for integrating the current corresponding to said first compared output, said capacitor provided between said current output terminal and a ground; and
  a buffer amplifier for supplying second control means for the voltage-controlled oscillator with the generated compared output voltage;
  wherein said low-frequency oscillator comprises:
    a second comparator for comparing said compared output voltage from said first comparator with a variable bias voltage and supplying said switching means with a second compared output;
    a third comparator for comparing one of an output of said switching means and said first compared output voltage with a fixed bias voltage and causing a third compared output to provide positive-feedback both to reference voltage varying means for varying said reference voltage and to bias varying means for varying said variable bias voltage; and
  wherein when said second compared output from said second comparator is not supplied through said switching means to said third comparator, said reference voltage is set so as to lead the oscillating frequency of said voltage-controlled oscillator to be said central frequency and said first compared output voltage is allowed to be input to said second control terminal of said voltage-controlled oscillator through said buffer amplifier while when said second compared output from said second comparator is supplied though said switching means to said third comparator, said first comparator said second comparator, and said third comparator are provided to be a positive-feedback circuit network which allows said low-frequency signal to be input to said second control terminal of said voltage-controlled oscillator through said buffer amplifier.

9. A phase synchronous circuit according to claim 6, wherein the first and second control terminals of said voltage-controlled oscillator each have an independent frequency control sensitivity.

10. An electronic device provided with a phase synchronous circuit for detecting the phase of an input signal by a phase detector circuit, filtering an output of said phase detector circuit by a low-pass filter, having an output of said low-pass filter provide negative-feedback to a first control terminal of a voltage-controlled oscillator, and inputting an output of said voltage-controlled oscillator to said phase detector circuit, thereby phase-synchronizing the frequency of said input signal with the central frequency of said voltage-controlled oscillator, said phase synchronous circuit comprising:

comparing means for comparing the output of said low-pass filter with a reference voltage which causes the central frequency of said voltage-controlled oscillator to be set, and for generating a compared output voltage by integrating a compared output current;

a low-frequency oscillator for generating a low-frequency signal to frequency-modulate the output of said voltage-controlled oscillator; and switching means for causing said compared output voltage to provide negative-feedback to a second control terminal of said voltage-controlled oscillator when said input signal is supplied to said phase synchronous circuit, while causing said low-frequency signal to be input to said second control terminal of said voltage-controlled oscillator when said input signal is not supplied to said phase synchronous-circuit.

\* \* \* \* \*